US007312799B2

(12) United States Patent
Klassen et al.

(10) Patent No.: US 7,312,799 B2
(45) Date of Patent: Dec. 25, 2007

(54) VISUAL DETERMINATION OF GAMMA FOR SOFTCOPY DISPLAY

(75) Inventors: R Victor Klassen, Webster, NY (US); Raja Bala, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 179 days.

(21) Appl. No.: 11/102,423

(22) Filed: Apr. 8, 2005

(65) Prior Publication Data

US 2006/0227148 A1 Oct. 12, 2006

(51) Int. Cl.

*G09G 5/00* (2006.01)
*G06K 9/00* (2006.01)
*G03F 3/08* (2006.01)
*H04N 1/46* (2006.01)
*H04N 5/57* (2006.01)
*G09G 5/10* (2006.01)

(52) U.S. Cl. ...................... 345/589; 345/593; 345/596; 345/618; 345/690; 348/603; 358/518; 358/519; 358/520; 358/534; 382/162

(58) Field of Classification Search ........ 348/559–560, 348/599, 602–603, 643–644, 655–660; 345/589–591, 345/593–594, 596–597, 600, 617–619, 690; 358/3.06, 516, 518–520, 534–538; 382/162–167; 715/700

See application file for complete search history.

(56) References Cited

U.S. PATENT DOCUMENTS 6,459,425 B1 * 10/2002 Holub et al. ................ 345/207
7,136,076 B2 * 11/2006 Evanicky et al. ........... 345/600
2005/0116961 A9 * 6/2005 Edge et al. ................. 345/600

OTHER PUBLICATIONS

William B. Cowan, “An Inexpensive Scheme For Calibration Of A Colour Monitor In Terms Of CIE Standard Coordinates”, Computer Graphics, vol. 17, No. 3, pp. 315-321.

* cited by examiner

*Primary Examiner*—Wesner Sajous
(74) *Attorney, Agent, or Firm*—Christopher D. Wait

(57) ABSTRACT

Provided herein are teachings directed to calibrating an output device such as a color display, using a visual method of determining the gamma for the blue primary that is easier to perform and more consistent than methodologies employing a luminance-matching task. The methodology is based on the insight that accurate gamma estimation for blue is important not for luminance reproduction, but for proper color-balance, and most importantly grey-balance. Thus, it follows to use grey-balancing, rather than luminance-matching, as the criterion for selecting the blue gamma value. One variant as taught herein is to provide a user visual task to find a patch best representing neutral, given previously determined calibrated digital values for the red and green primaries that produce 50% fractional luminance. A large patch is displayed within a larger surround containing both a white border and either a checkerboard or a line pattern, so as to establish a reference for the neutral axis. The user adjusts a control causing only the value of the blue primary to change. This changes the color of the patch in the middle, moving it along a line from yellowish to bluish. The user thus selects the value at which the patch appears most nearly neutral with respect to the surround. Effectively, the task is to match the chromaticity of a grey patch with that of a halftone pattern.

19 Claims, 2 Drawing Sheets

VISUAL DETERMINATION OF GAMMA FOR SOFTCOPY DISPLAY

BACKGROUND AND SUMMARY

The teachings presented herein relate generally to calibration of output display devices. The teachings presented herein relate more specifically to calibration of color displays.

The need for "soft-proofing" continues to grow especially in the graphic arts and production color markets. It is also expected to play an increasingly important role in distributed and remote color management applications. To be useful, soft-proofing depends for its deployment upon having a calibrated display. At the high end of the graphic arts market, users are willing to calibrate their displays using expensive instruments. Further down market, users may use interactive visual calibration techniques. These visual techniques are not as accurate as their measurement-based counterparts; but they are relatively inexpensive, and the quality is sufficient for many applications.

An important color characteristic of display devices is the 1-dimensional tone response of each of the R, G and B (red, blue, and green) primaries. For CRTs (Cathode-Ray Tubes) and many LCDs (Liquid Crystal Displays), this tone response is described by a power-law relationship between input digital value and displayed luminance. The exponent of the power-law is frequently referred to as "gamma". The focus of the teachings provided herein below is on the estimation of correct gamma for a given display as user determined by the employment of visual tasks.

Previous techniques for gamma estimation either a) assume all three channels are identical; or b) provide the same controls for all three channels. Perhaps the most well-known prior art approach involves adjusting the digital value of a continuous-tone patch (which could be pure R, G, B or R=G=B) until its lightness matches that of a halftone pattern generated using alternating on/off lines. One GUI (Graphical User Interface) implementation providing a user visual task for luminance-matching is as shown in FIG. 1. Here Gamma determination is made by 50% luminance-matching. The sliders 100 associated with each color patch R, G, and B, are user adjusted until the left half 110 and right half 120 are determined as matching in lightness. In this particular embodiment, the left half 110 has exactly ½ black and ½ full on continuous-tone color as provided here by interlaced horizontal stripes alternating between black and contone (continuous-tone) color.

The assumption relied upon here is that the fractional luminance of the halftone pattern is 50% (as provided in the left half 110), i.e. it is halfway between the luminance provided at full-off and full-on. The desired determined value of gamma is estimated from the digital value needed to match the 50% fractional luminance by the equation 1 which follows:

$$Y_{HT}=(D_{select}-D_{offset})^{\gamma} \Rightarrow \gamma=\log(Y_{HT})/\log(D_{select}-D_{offset}) \quad \text{Eqn. (1)}$$

where $D_{select}$ is the digital value selected in the visual task, $Y_{HT}$ is the fractional luminance of the 50% halftone pattern. $D_{offset}$ is the offset value below which there is no discernable response from the device. This parameter is obtained separately either from measurements or from visual tasks.

The technique just described is in widespread use within many commercially available display calibration tools, and it is believed was first mentioned in the publication to William B. Cowan, "An Inexpensive Scheme For Calibration Of A Colour Monitor In Terms Of CIE Standard Coordinates", Computer Graphics, Vol. 17, No. 3, pp. 315-321.

Visual tasks that assume the same gamma for the 3 channels use greyscale (R=G=B) images or patches, and are generally simple to execute. However, the equi-gamma assumption is often incorrect. The Photoshop™ 3.0 calibration tool for example attempts to correct for this assumption by having the users perform a grey-balance adjustment jointly with the 50% greyscale luminance matching task. However, this is an iterative procedure that can produce inconsistent results from observer to observer.

Since the power-law response is a channel-wise phenomenon, it makes more sense to estimate gamma separately for each of the 3 channels as described above and shown by FIG. 1. The problem with this approach is that luminance judgments are very difficult to perform for the blue primary. Vision scientists believe that the blue (short-wavelength) sensor response does not contribute to the human visual system's luminance channel. The medium and long wavelength sensors also respond, but to a much lesser extent, to light generated by the blue phosphor of a CRT or other color display device. Hence, relatively large changes to the strength of the blue signal yield small changes in the visual response. The resulting difficulties in the visual task produce large variances in the estimated gamma value for blue.

What is needed is a straight-forward visual method of determining the gamma for the blue primary that is easier to perform and more consistent than the luminance-matching task solution provided by the prior art.

Disclosed in embodiments herein is a method of determining correct color gamma for a display device as driven by three primary signals. The method comprises luminance-matching to determine the respective gamma value for two of the three primary signals and, grey-balancing to determine the respective gamma value for the remaining primary signal of the three primary signals.

Further disclosed in embodiments herein is a method of determining calibration functions for a display device. The method comprises luminance-matching to determine the respective calibration functions for at least two primary signals and, grey-balancing to determine the respective calibration function for at least one additional primary signal, where the grey-balancing employs the respective calibration functions for the at least two primary signals as determined in the luminance-matching step.

Further disclosed in embodiments herein is a visually based method for determining gamma color correction for a display device. This method comprises providing a luminance-matching visual task on the display device and capturing the user selection of a first color indicated by the user as a match in luminance. The gamma for the first color is then calculated using the captured user selection indicated as a match in luminance. Then a grey-balancing visual task for a second color is provided on the display device, which employs the calculated gamma for the first color in the display of the grey-balancing visual task. This is followed by capturing the user selection of the second color indicated by the user as a match in chromaticity, and calculating the gamma for the second color using the user selection indicated as a match in chromaticity.

DETAILED DESCRIPTION

A methodology is herein taught for calibrating an output device, such as a color display, using a visual method of determining the gamma for the blue primary that is easier to perform and more consistent than methodologies employing a luminance-matching task. The methodology is based on the insight that accurate gamma estimation for blue is important not for luminance reproduction, but for proper color-balance, and most importantly grey-balance. Thus, it follows from this insight to use grey-balancing, rather than luminance matching, as the criterion for selecting the blue gamma value. It is to be understood that the term "display" may include the cathode ray tube (CRT), liquid crystal display (LCD), projection LCD, digital light projector (DLP), and other similar technologies.

This exemplary method is based on recognizing two features of the human visual system: first, the short-wavelength (blue) receptors have little or no influence in determining perceived lightness. Rather, it is the medium (green) and long (red) receptors, which, combined, provide the indication of lightness. For this reason the classical color matching task used in establishing gamma is of relatively low precision for the blue case, as compared to the red or green; second, the human visual system is very sensitive to small deviations from neutral, especially in large patches of constant color. Our notion of neutral is somewhat affected by the white point of our adapting environment, so providing a reference white is beneficial.

Figure 1:
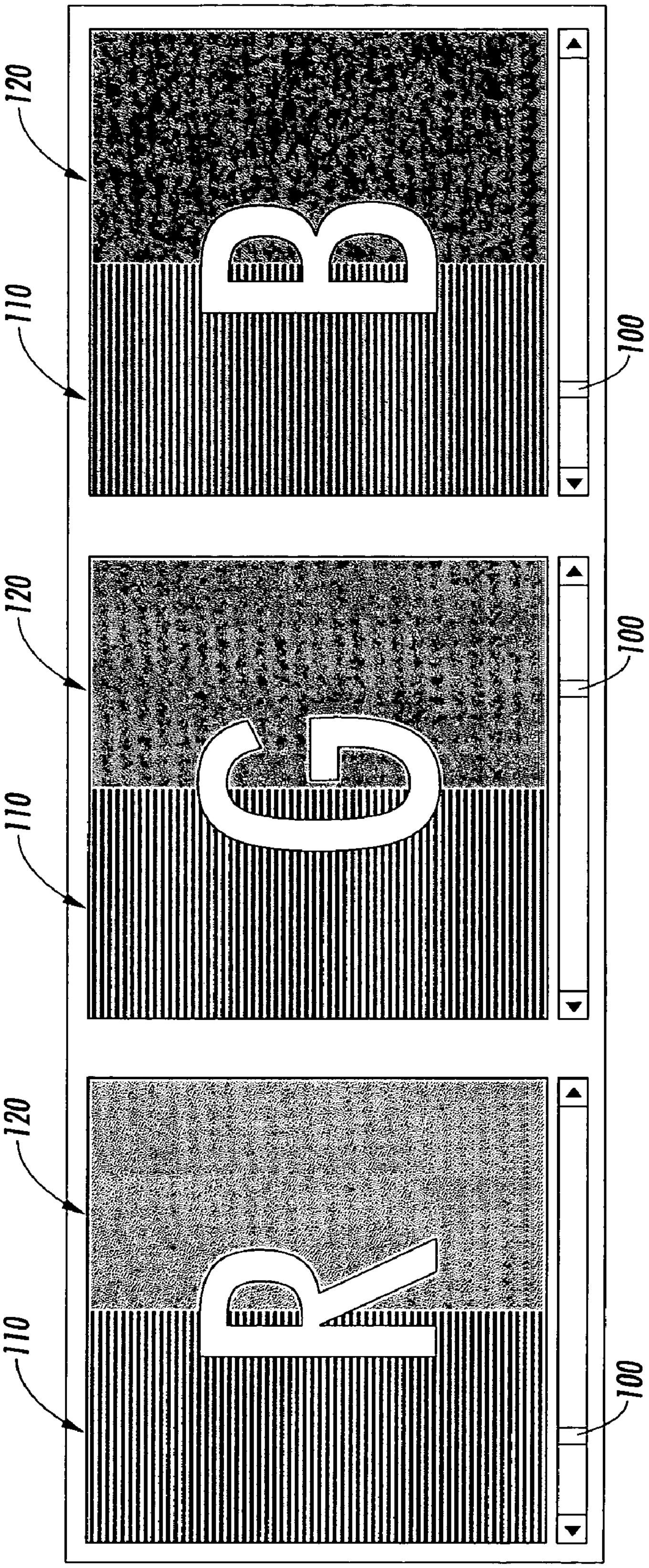
FIG. 1 PRIOR ART
FIG. 1 shows a Graphical User Interface display screen for user adjustment of gamma, as taught by the prior art.

One variant of this exemplary method as taught herein is to provide a user visual task to find a patch best representing neutral, given previously determined calibrated digital values for the red and green primaries that produce 50% fractional luminance. (The latter are obtained from any standard approach, e.g. the task and GUI shown in FIG. 1). One embodiment conforming to the teachings provided herein is shown by the GUI in FIG. 2, and employs grey-balancing, where a large patch 200 is displayed within a larger surround 205 (210 & 220), which contains a white border 210 and a reference grey presented preferably as a checkerboard or a line pattern 220, to establish a reference for the neutral axis. The purpose of the white border and reference grey are to make the user's white point invariant to the surrounding environment in the room. Thus, the white border 210 is a region on the display, typically surrounding the patches to be grey balanced, and having values of full-on for all of the three (red, green and blue) primaries. The checkerboard or line pattern comprises full black and full white pixels giving yet another reference for a hue of neutral grey as provided upon the given display. The user adjusts a slider 100, causing only the value of the blue primary to change. This changes the color of the patch 200 in the middle, moving it along a line from yellowish to bluish. The user selects the value at which the patch 200 appears most nearly neutral with respect to the surround 205. Effectively the task is to match the chromaticity of the patch 200 with that of the halftone pattern 220 (which by definition is the same as that of the display white 210). The selected value can then be used to estimate gamma for the blue primary by substitution into Eqn. (1) as discussed above.

Note that this method of grey-balancing relies upon a "chromaticity constancy" assumption (as it sometimes called) which states that different levels of a pure primary produce the same x-y chromaticity coordinates. This assumption is typically valid for CRT displays, but is violated in some LCDs (especially the low-cost versions found in laptop computers). When the assumption is violated, the estimate of gamma obtained by single-primary luminance-matching can be significantly different from that obtained by grey-balancing (the difference being systematic, and larger than inter-observer variations). This will be discussed further below.

A reduction to practice was implemented as a JAVA applet and tested on a commonly available computer CRT display. Five observers were first asked to perform the 50% luminance-matching task for each of the R, G, B channels using the methodology as described and shown in FIG. 1 above. All but one observer performed the task twice, providing a total of 9 observations. Gamma estimates for the R, G and B channels were then calculated using Eqn. (1) above.

Figure 2:
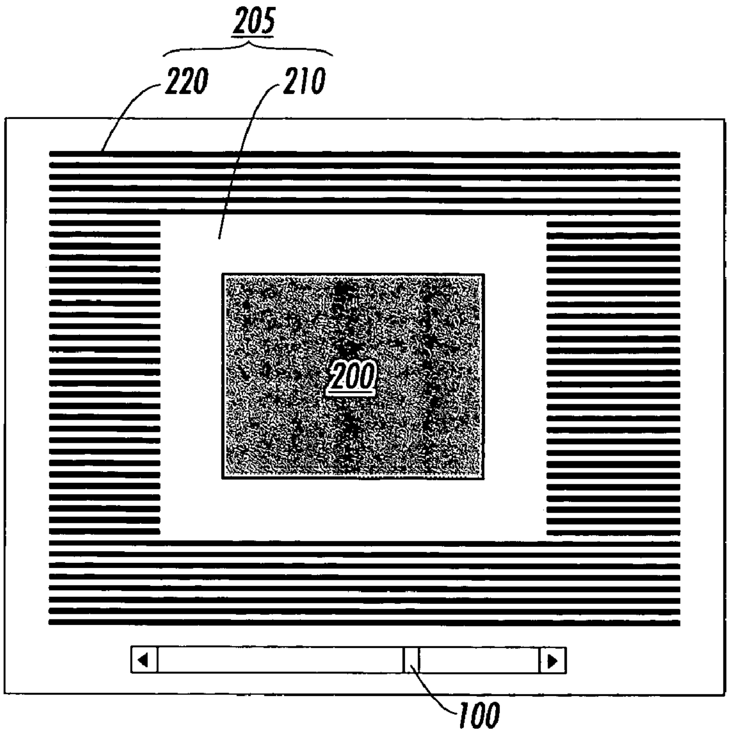
FIG. 2 shows an exemplary Graphical User Interface display screen embodiment for user adjustment of gamma, suitable for performing the teachings provided herein, where the user adjusts the slider until the patch in the middle appears neutral "grey" with respect to the surround.

Subsequently each observer was then asked to perform the grey-balance task as described and shown in FIG. 2 to determine a second gamma estimate for the blue channel. (The R and G values were retained and used as taken from the previous task) Eqn. (1) was again applied, however, this time the value for $D_{select}$ was the blue digital value that produced the best grey-balance match with the surround 205 (210 & 220) of FIG. 2.

In Table 1, statistics are compared for the nine gamma estimates for the blue channel from the luminance-matching vs. grey-balancing tasks. The precision used in this implementation resulted in a quantization step of 0.04 for gamma values.

TABLE 1

Statistics for blue gamma estimates from standard luminance-matching vs. proposed grey-balancing

| | Average | Std. Dev | Minimum | Maximum | Largest single-observer range |
|---|---|---|---|---|---|
| Luminance-matching | 2.24 | 0.138 | 2.07 | 2.51 | 2.17-2.51 |
| Grey-balancing | 2.26 | 0.027 | 2.25 | 2.33 | 2.25-2.29 |

The results show that the average gamma estimates from the two approaches are the same (i.e. within quantization precision). However, the proposed grey-balancing matching task utilizing the GUI of FIG. 2 produces substantially less variance than the standard luminance-matching task of the prior art. This is true both across observers and across repetitions of the task by a single observer.

While it is instructive to examine the consistency of the gamma estimates, what is of ultimate interest is the image quality from the resulting correction. That is, we would like to see how variances in gamma estimates translate to differences in image reproduction. To this end, an 8×8×8 uniformly sampled RGB grid was generated. These RGB values are to be interpreted as raw device values driving the CRT. The R and G channels were raised to powers of 2.21 and 2.17 respectively. The B channel was raised to the minimum gamma value of 2.07 obtained from the luminance-matching experiment. The result is a set of RGB values linearized in luminance according to the visual gamma estimates. These RGB values were converted to XYZ and then to CIELAB, assuming sRGB primaries and white point. A second set of CIELAB data was obtained using the same procedure, but assuming the maximum gamma of 2.51 from the luminance-matching experiment. CIE ΔE differences were computed between the two data sets, and are shown in Table 2. Clearly the variations in observers' response to the visual task produce some significant ΔE errors.

The same calculation was performed using the minimum and maximum blue gamma estimates from the grey-balancing approach. These are also included in Table 2. Clearly, the grey-balancing approach results in far less intra- and inter-observer variation, thus offering a more consistent and robust approach to gamma estimation for the blue channel.

TABLE 2

Observer variations from the luminance-matching vs. grey-balance approach, measured in CIE 1976 ΔE units.

| | CIELAB ΔE | | |
|---|---|---|---|
| | Average | 95th Percentile | Maximum |
| Luminance-Matching | 5.41 | 11.2 | 15.2 |
| Grey-Balancing | 0.98 | 2.03 | 2.80 |

Recall the earlier concern mentioned above about the efficacy of the invention in the case where chromaticity-constancy is not upheld. To address this concern, the same visual tasks were performed on a laptop LCD specifically found to violate chromaticity-constancy. The corrected electronic images obtained from both the luminance-matching and the grey-balancing tasks were compared with calibrated prints viewed in a light booth. The general observations are:—(a) consistency in observer responses in the grey-balance task as taught herein is again superior to that in the luminance-matching task;—(b) the biggest differences in the images are seen near the neutral axis;—(c) the grey-balancing approach as taught herein corrects input pixels with approximately equal R, G, B values to render with a chromaticity near that of the display white point, which is not the case with the luminance-matching approach; and,—(d) in terms of overall quality, it was found that the grey-balance methodology as taught herein produces a closer match to the print than the luminance-matching approach in a few image regions. In no instance did the grey-balance approach produce a worse result. Thus, the exemplary methodology as taught herein offers not only a significant advantage in consistency of results, but also a potential advantage in image quality for displays such as LCDs that do not conform to the standard CRT model.

Figure 3:
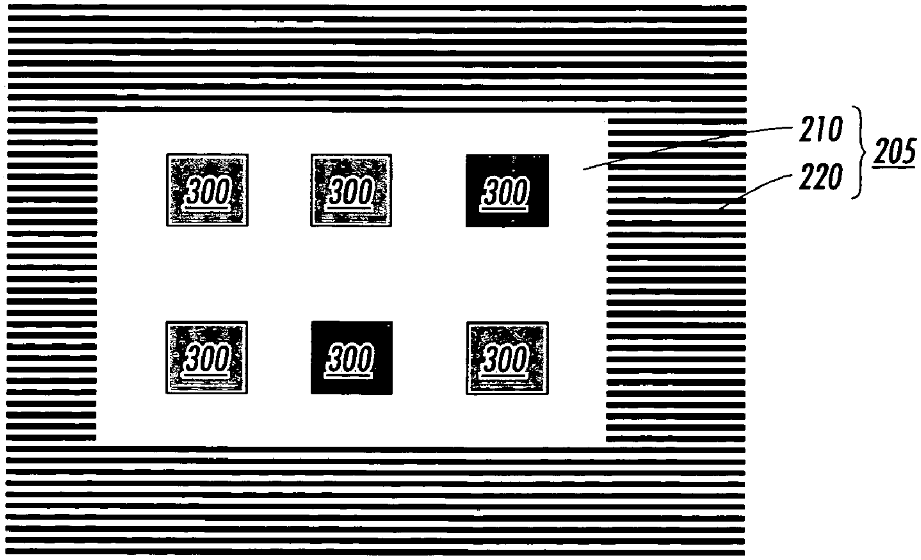
FIG. 3 shows an alternative exemplary Graphical User Interface display screen embodiment for user adjustment of gamma, suitable for performing the teachings provided herein, where the user selects the most neutral patch.

FIG. 3 provides a depiction of an alternative embodiment for the user grey-balancing task GUI. Retained here from the GUI of FIG. 2 is the surround 205 comprised of a white border 210 and line pattern 220. However, the slider bar is dispensed with, and instead a fixed set of patches 300 each of varying grey-level is provided inside the white border 210 that will span the possible range of gamma values. The user then selects the patch 300 that provides the closest match.

A variant of the above approach as discussed relative to FIG. 3, is to have the user select from a small set of patches 300 the one considered closest to grey. Subsequently, a new GUI window with a new set of patches 300 is presented with the previously selected patch 300 at its center, with a narrower range of grey patches surrounding it. This is repeated until the desired level of precision is reached. For example, assuming monitors have gammas in the range 1.0 to 2.5, the first set might be 1.375, 1.75, 2.125. If the user selects 2.125, the next set would be 1.9375, 2.125, 2.3125. On each step, the set would represent a narrower range of gammas, until the desired precision is reached. The assumption in this approach is that if the user selects a given patch 300 from a set of three equally spaced patches, then the "true" value is between the value for that patch plus half a space and the value minus half a space. This assumption can be relaxed by making the sets shrink more slowly.

To recapitulate, one methodology as taught herein provides the following basic steps:

1) Establish the gamma level settings for the red and green channels for a given display using luminance-matching.

2) Establish the gamma level setting for the blue channel for a given display using grey-balancing at a 50% grey level.

However, other arrangements are contemplated as within the confines of the present teaching, for example and especially for displays that violate chromaticity constancy, multiple grey levels could be matched. That is, in addition to matching the grey at 50%, lines combining the 50% grey with 100% white or black could be matched to grey patches in a subsequent step, or grey levels of 25% or 75% may also be employed. This would provide values for a multi-parameter model (rather than the single-parameter gamma model).

Further, in the above two-step methodology only the blue value is adjusted until a chromaticity match with the surrounding pattern is achieved. If this should not suffice (as might be the case for low cost LCDs), an additional control on the red channel may be necessary to better achieve a satisfactory chromaticity-match. This would then be used to estimate the gamma for both the blue and red channels. Also, in addition to matching the chromaticity of the patch with that of the surround, another control (such as a rheostat, dial, buttons or another slider 100 be it real/mechanical or software/virtual) could be added to achieve a luminance-match between the two stimuli. This could be implemented within the same or a separate panel.

As will be clear to one skilled in the art, the gamma calibration tasks described above may be provided as a software platform, a software platform operating on a hardware platform or even provided as hardwired logic. The gamma calibration tasks may be resident on an outboard personal computer or provided inboard of a display. The display may be the typical three primary type or it may be a five or six or more color type display incorporating colors beyond the primaries discussed above such as orange, cyan, and purple for example.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. A method of determining correct color gamma for a display device as driven by at least three primary color signals, comprising:

providing a first user visual task on the display device, the first user visual task further providing a continuous-tone patch and a halftone pattern for two of the at least three primary color signals;

luminance-matching to determine the respective gamma value for the two of the at least three primary color signals based on the first user visual task;

providing a second user visual task on the display device, the second user visual task further providing a halftone gray patch and a continuous-tone grey patch while employing the determined gamma values from the luminance-matching step; and, grey-balancing to determine the respective gamma value for the remaining primary color signal of the at least three primary color signals based on the second user visual task.

2. The method of claim 1 wherein the two of the at least three primary color signals are red and green.

3. The method of claim 1 wherein the remaining primary color signal is blue.

4. The method of claim 1 wherein the grey-balancing step employs the determined gamma values for the two of the three primary signals resulting from the luminance-matching step.

5. The method of claim 1 wherein the said grey-balancing step provides visually matching the chromaticity of a continuous-tone patch comprised of three of the three primary color signals, as against the chromaticity of the halftone pray patch further comprised of a halftone pattern alternating between minimum and maximum grey; and, as against the chromaticity of a patch of white.

6. A method of determining calibration functions for a display device as driven by at least three primary color signals, comprising:

providing a first user visual task on the display device, the first user visual task further providing a continuous-tone patch and a halftone pattern for two of the at least three primary color signals;

luminance-matching to determine the respective calibration functions for the two of the at least three primary color signals based on the first user visual task;

providing a second user visual task on the display device, the second user visual task further providing a halftone pray patch and a continuous-tone prey patch while employing the determined calibration functions from the luminance-matching step; and, grey-balancing to determine the respective calibration function for at least one additional primary color signal of the at least three primary color signals as based on the second user visual task.

7. The method of claim 6 wherein the said grey-balancing step provides visually matching the chromaticity of a continuous-tone patch comprised of the two of the at least three primary signals and the at least one additional primary color signal, as against the chromaticity of the halftone gray patch further comprised of a halftone pattern alternating between minimum and maximum grey; and, as against the chromaticity of a patch of white.

8. The method of claim 6 wherein the two of the at least three primary color signals are red and green.

9. The method of claim 8 wherein the at least one additional primary signal is blue.

10. The method of claim 8 wherein the at least one additional primary color signal comprises orange.

11. The method of claim 10 wherein the at least one additional primary color signal comprises purple.

12. The method of claim 6 wherein the second user visual task on the display device provides a plurality of halftone pattern patches, each halftone patch alternating between minimum and maximum at a different average luminance level.

13. The method of claim 7 wherein the halftone pattern alternating between minimum and maximum grey is at a 25% average luminance level.

14. The method of claim 7 wherein the halftone pattern alternating between minimum and maximum grey is at a 50% average luminance level.

15. The method of claim 7 wherein the halftone pattern alternating between minimum and maximum grey is at a 75% average luminance level.

16. A method of determining calibration functions for a display device, comprising:

luminance-matching to determine the respective calibration functions for at least two primary signals; and, grey-balancing to determine the respective calibration function for at least one additional primary signal, where the grey-balancing employs the respective determined gamma values from the respective calibration functions for the at least two primary signals as determined in the luminance-matching step, the grey-balancing step further comprising:

providing for visually matching the chromaticity of a continuous-tone patch comprised of the at least two primary signals and the at least one additional primary signal, as against the chromaticity of a patch of halftone pattern alternating between light and dark grey at a different average luminance level, and as against the chromaticity of a patch of white.

17. The method of claim 16 wherein the patch of halftone pattern alternating between light and dark grey is at a 25% average luminance level.

18. The method of claim 16 wherein the patch of halftone pattern alternating between light and dark grey is at a 50% average luminance level.

19. The method of claim 16 wherein the patch of halftone pattern alternating between light and dark grey is at a 75% average luminance level.

* * * * *